US007291821B2

United States Patent
Robbins (10) Patent No.: US 7,291,821 B2
(45) Date of Patent: Nov. 6, 2007

(54) CCD DEVICE HAVING A SEQUENCE OF ELECTRODES FOR CHARGE MULTIPLICATION

(75) Inventor: Mark Stanford Robbins, Essex (GB)

(73) Assignee: E2V Technologies (UK) Limited, Chelmsford (GB)

( * ) Notice: Subject to any disclaimer, the term of this patent is extended or adjusted under 35 U.S.C. 154(b) by 0 days.

(21) Appl. No.: 11/394,213

(22) Filed: Mar. 31, 2006

(65) Prior Publication Data
US 2006/0231738 A1 Oct. 19, 2006

(30) Foreign Application Priority Data
Mar. 31, 2005 (GB) .................. 0506577.6

(51) Int. Cl.
*H01L 27/00* (2006.01)

(52) U.S. Cl. ................. 250/208.1; 250/214 R (58) Field of Classification Search ............. 250/208.1, 250/214 R, 239, 214 LA; 257/290–294, 257/440; 348/294–298, 311–317, 303
See application file for complete search history.

(56) References Cited

U.S. PATENT DOCUMENTS 5,337,340 A * 8/1994 Hynecek ................. 377/60

* cited by examiner

*Primary Examiner*—Que T Le
(74) *Attorney, Agent, or Firm*—Venable LLP; Robert Kinberg (57) ABSTRACT

A CCD device includes multiplication elements arranged so as to multiply charge by clocking with a high voltage. An additional region beneath the high voltage electrode is so doped in relation to at least the preceding electrode as to have a higher depleted charge density than under the preceding electrode. This assists in preventing high energy electrodes from encountering the silicon surface of the semiconductor.

9 Claims, 9 Drawing Sheets

CCD DEVICE HAVING A SEQUENCE OF ELECTRODES FOR CHARGE MULTIPLICATION

CROSS-REFERENCE TO RELATED APPLICATION

This application claims the priority of British Patent Application No. 0506577.6 filed on Mar. 31, 2005, the subject matter of which is incorporated herein by reference.

BACKGROUND OF THE INVENTION

The present invention relates to a CCD device, and in particular to a CCD imager which provides gain in a CCD channel.

In a typical CCD imager, signal charge representative of incident radiation is accumulated in an array of pixels in an image area. Following an integration period, signal charge is transferred to a store section and then to an output register by applying appropriate clocking or drive pulses to control electrodes. The signal charge is then read out from the output register and applied to a charge detection circuit to produce a voltage which is representative of the amount of signal charge. The sensitivity of such a device is limited by the noise of the charge to voltage conversion process and that introduced by the subsequent video chain electronics.

Figure 1:
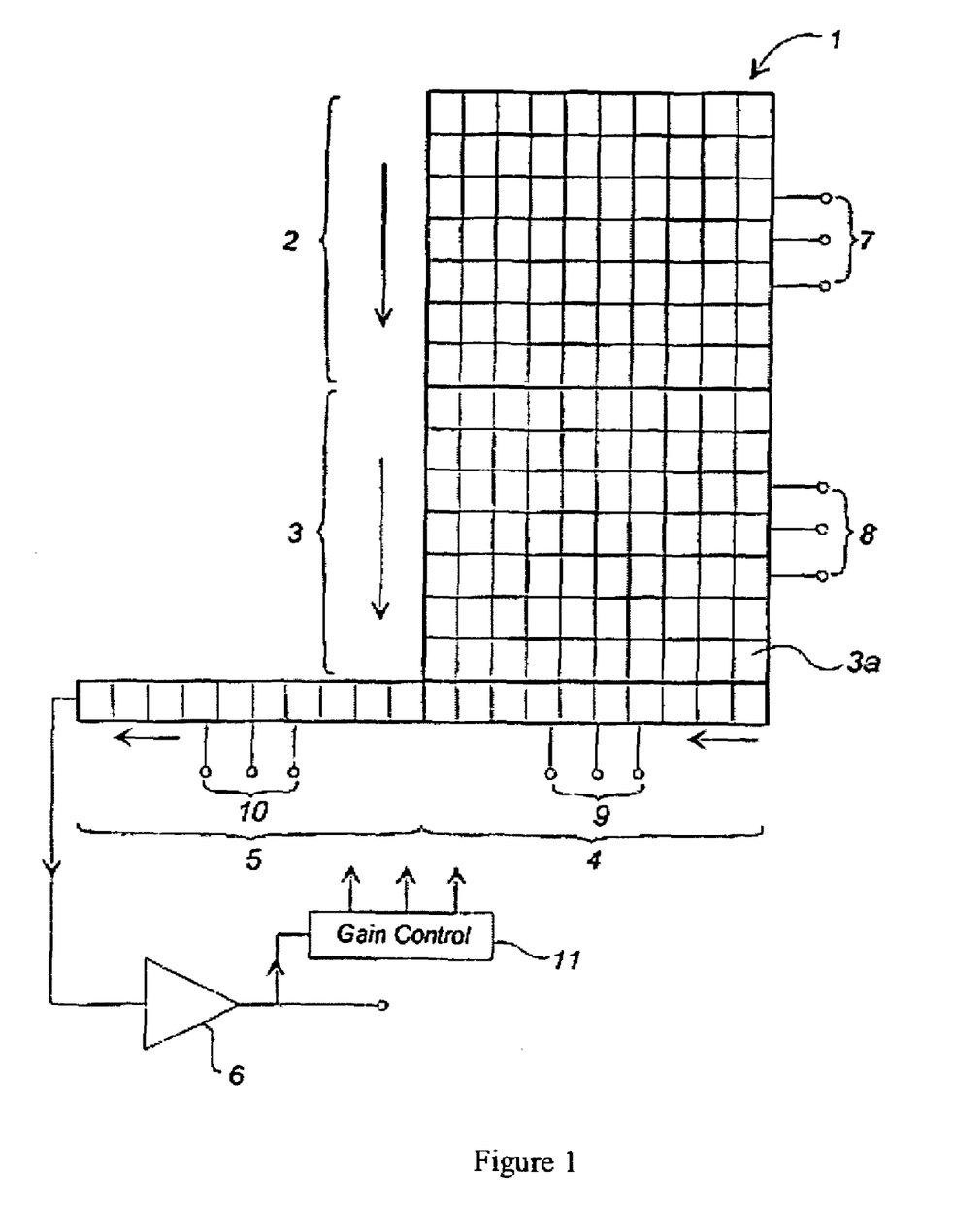
FIG. 1 is a schematic diagram of a CCD imager of known type and which may embody the invention.

An electron multiplying CCD overcomes this limitation and is disclosed in our earlier published UK patent application GB-A-2,371,403, as shown in FIG. 1. A CCD imager 1 comprises an image area 2, a store section 3 and an output or read-out register 4, each of these components being found in a conventional CCD imager. The output register 4 is extended serially to give a multiplication register 5, the output of which is connected to a charge detection circuit 6.

During operation of the device, incident radiation is converted at the image area 2 into signal charge which is representative of the intensity of the radiation impinging on the array of pixels making up the image array. Following the image acquisition period, drive pulses are applied to control electrodes 7 to transfer the charge accumulated at the pixels of the image area 2 to the store section 3. Simultaneously with this, drive signals are also applied to control electrodes 8 at the store section 3 to cause charge to be transferred from row to row as indicated by the arrow, the last row of charge held in elements in row 3 being transferred in parallel to the output register 4.

When a row of signal charge has been transferred into the output register 4, appropriate drive pulses are applied to the electrodes 9 to sequentially transfer the charge from the elements of the output register to those of the multiplication register 5. In this embodiment, the multiplication register is of similar architecture to the output register in so far as doping is concerned with the addition of an electrode for multiplication. To achieve multiplication of charge in each of the elements of the multiplication register 5, sufficiently high amplitude drive pulses are applied to control electrodes 10 to both transfer signal charge from one element to the next adjacent element in the direction shown by the arrow and also to increase the level of signal charge due to impact ionisation by an amount determined by the amplitude of the drive pulses. Thus, as each packet of charge is transferred from one element to the next through the multiplication register, the signal charge increases. The charge detected at circuit 6 is thus a multiplied version of the signal charge collected in the output register 4. At each stage of the multiplication register, the signal charge is increased. Each signal charge packet stored in the output register 4 undergoes an identical multiplication process as each travels through all the elements of the multiplication register 5.

The output of the charge detection circuit 6 is also applied to an automatic gain control circuit 11 which adjusts the voltages applied to the multiplication register 5 to control the gain. In other embodiments, this feedback arrangement is omitted. Gain may then be controlled manually if desired.

We have appreciated that improvements can be made to the gain performance of CCD devices which provide gain in a CCD channel. In particular, we have appreciated that the gain performance of such a CCD device can deteriorate with time of use.

SUMMARY OF THE INVENTION

The invention is defined in the claims to which reference is directed. An embodiment of the invention is a CCD imager which has an additional register for charge multiplication. Within the additional register each element has a sequence of electrodes, between which voltages are applied, in use, so as to clock charge through the element and apply gain. At least one of the electrodes is a high voltage electrode which has a voltage applied high enough in comparison to a preceding DC electrode so that the fields experienced by electrons cause impact ionisation. In the region beneath this electrode doping is provided in a semiconductor layer so that the region has a higher depleted charge density than under the previous electrode or more generally than under (including the previous electrode)the surrounding semiconductor. As an example, n-type semiconductor will have additional n-type doping. The key point in the embodying device is that the depleted charge density is higher than under the DC electrode.

The additional charge density caused by doping choice alters the trajectory of electrons within the semiconductor due to the modified potential distribution within the silicon and prevents electrons encountering the surface of the semiconductor. This prevents or reduces build up of trapped charge which would otherwise degrade the gain performance of the device for a given voltage bias applied.

BRIEF DESCRIPTION OF THE DRAWINGS

An embodiment of the invention will now be described by way of example and with reference to the accompanying figures in which.

DETAILED DESCRIPTION OF THE INVENTION

The present embodiment comprises a CCD device such as a CCD imager of known type but modified to change the doping arrangement of a multiplication element in a multiplication register. Such a known device is shown and has been described in relation to FIG. 1. The invention may be embodied in such a device, and in an imager or camera including such a device, and in an imager or camera including such a device.

As shown in FIG. 1, an image area 2 accumulates charge in CCD elements and transfers charge under control of clocked drive pulses on electrodes 7, 8 to a store area 3 and from the store area to an output register 4 and subsequently to a multiplication register 5. It is in the multiplication register that the invention is embodied, though it will be appreciated that other arrangements of multiplication elements could be used. Although shown as a straight line extension of the output register 4, in reality it will probably be bent around the imager for packaging reasons.

Figure 2:
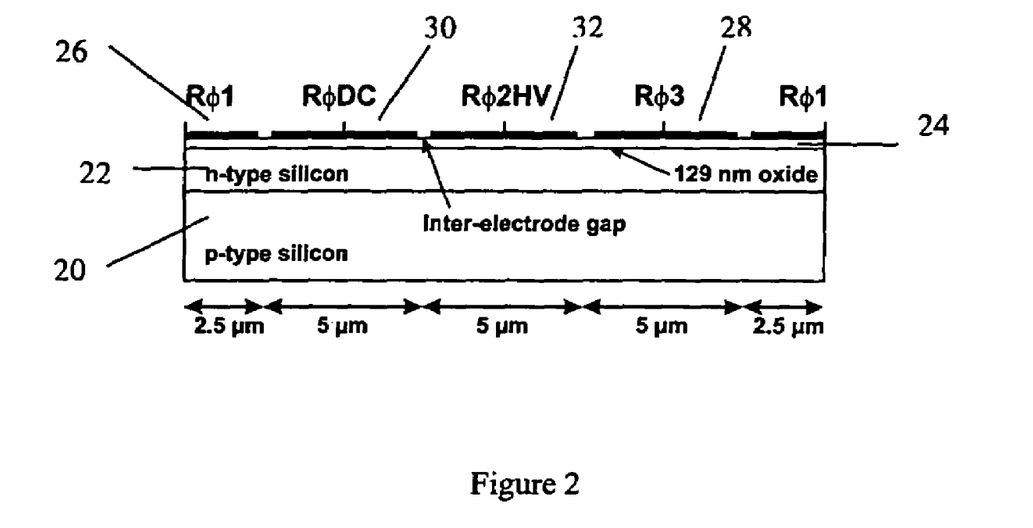
FIG. 2 is a schematic diagram of a physical cross section of one element in a multiplication register.

A multiplication element of known type is shown in FIG. 2. The element comprises a base 20 of p-type silicon, an n-type layer 22 and a gate dielectric layer 24 which may, as an example, comprise a layer of $Si_3N_4$ over $SiO_2$ or $SiO_2$ only. On the gate dielectric layer, each element has four electrodes shown as normal clocked electrodes R$\phi$1 26 and R$\phi$3 28, a DC electrode R$\phi$DC 30 and a high voltage electrode R$\phi$HV 32. The element provides gain by clocking voltages at the electrodes such that a relatively high voltage at electrode R$\phi$HV 32 causes impact ionisation of charge.

Figure 3:
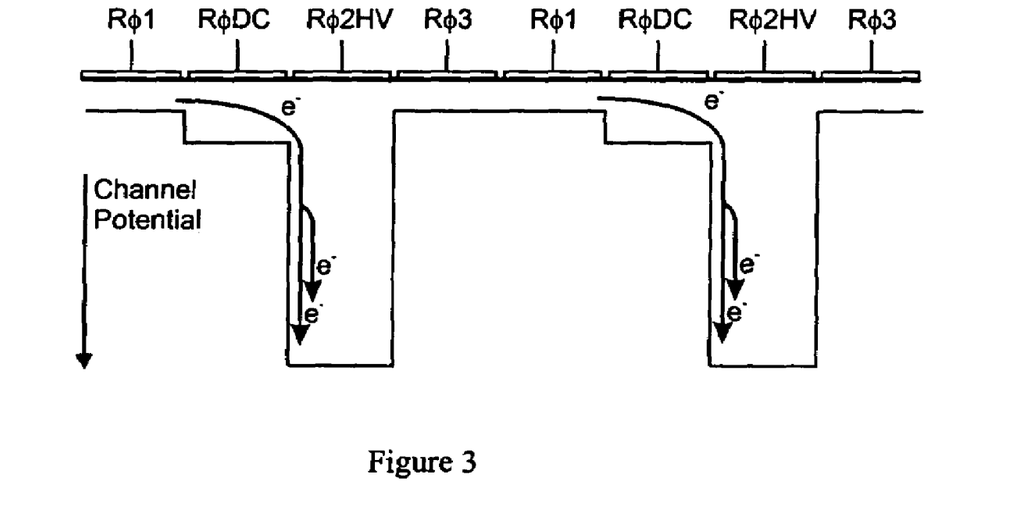
FIG. 3 shows the channel potential of two of the elements shown in FIG. 2.

The clocking of the electrodes is shown explained with reference to FIG. 3. The multiplication element of the multiplication register is made up of four phases although other configurations could be possible. R$\phi$1 and R$\phi$3 are clocked as normal readout register phases. R$\phi$DC is a DC phase that separates R$\phi$1 from R$\phi$2HV. R$\phi$2HV, the multiplication phase, is a clocked phase but using a much greater amplitude than R$\phi$1 and R$\phi$3. On the high to low transition of R$\phi$1 (the potential increasing in the direction of the arrow in FIG. 3), the signal originally under R$\phi$1 will drift to R$\phi$2HV. The potential on R$\phi$2HV is set high enough so that the fields experienced by the electron signal will cause impact ionisation to take place. Once the signal electrons and the electrons created by the impact ionisation are collected under R$\phi$2HV the total amplified signal can then be transferred to R$\phi$3 by switching R$\phi$2HV low and R$\phi$3 high. The process is repeated through all the gain (multiplication) elements in the multiplication register. As an example, the device could have 591 gain elements. If the impact ionisation increases the signal by 1% at each element, the combined gain of the multiplication register of the CCD will be $1.01^{591}=358$.

Figure 4:
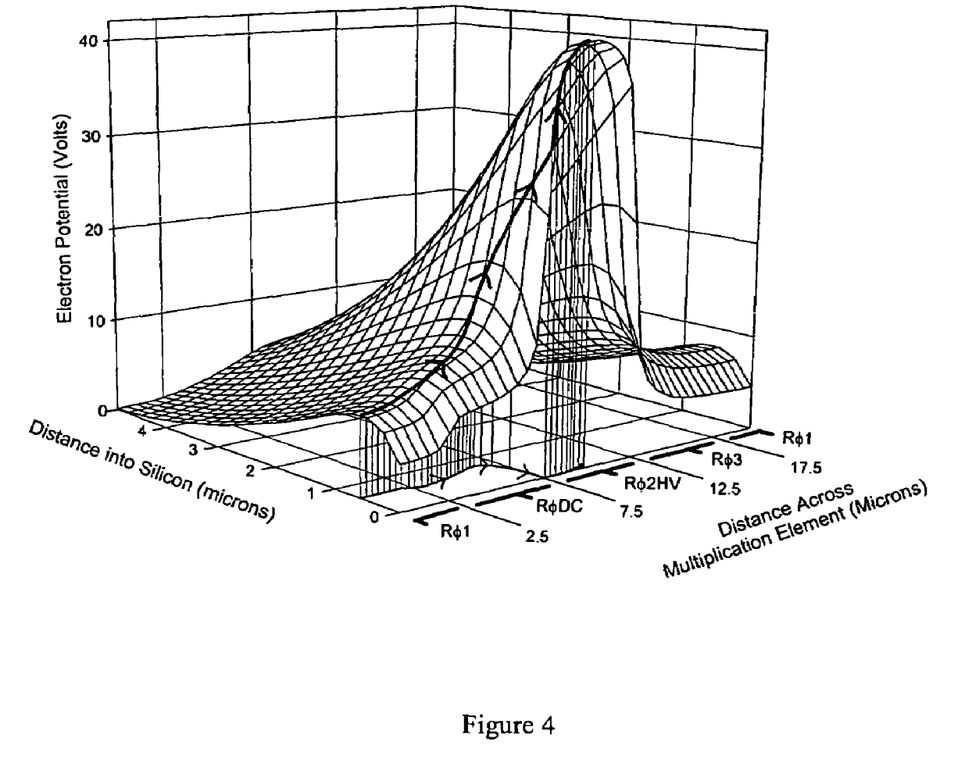
FIG. 4 shows the potential distribution in a multiplication element.

As shown, charge is increased in each (multiplication) element by application of voltage at R$\phi$2HV which causes electrons to form from the impact ionisation process. It is noted, for the avoidance of doubt, that the voltages shown are clocked and so vary in amplitude. The voltages are shown at a given instant. The potential distribution within the silicon layer as a result of the applied voltages at a moment when R$\phi$2HV is at its high level and R$\phi$1 is at its low level is shown in FIG. 4.

We have appreciated that the gain achieved in each element for a given voltage applied at R$\phi$2HV decreases with usage time of the device, and that the reason for this is due to an accumulation of charge at the dielectric boundary and within the gate dielectric as will now be described.

Figure 5:
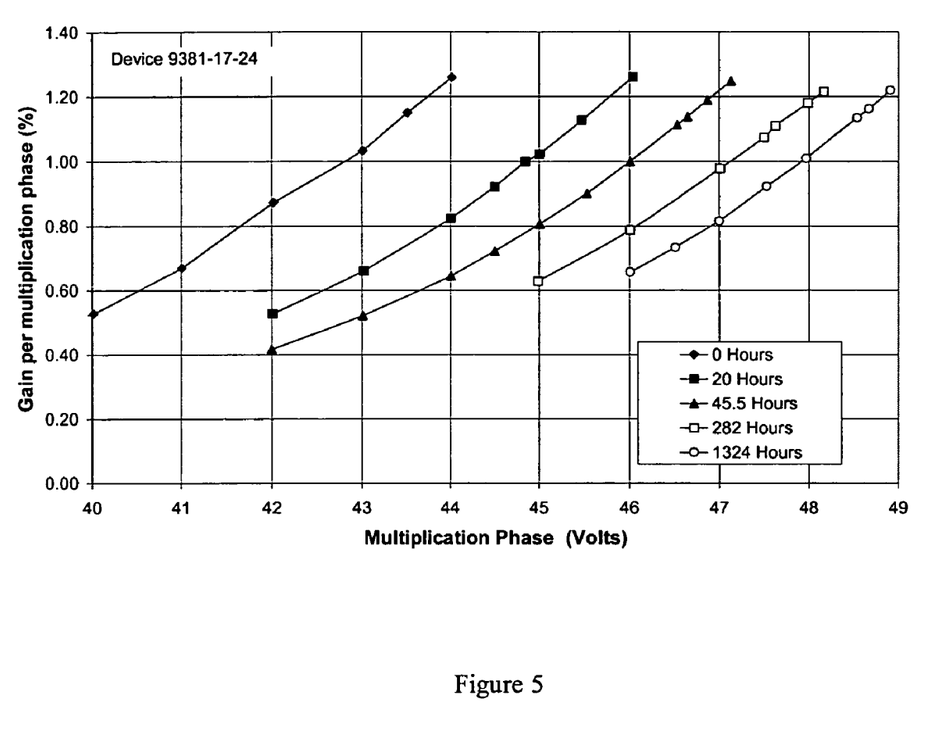
FIG. 5 shows a graph of the gain against multiplication phase voltage for differing usage times.
Figure 6:
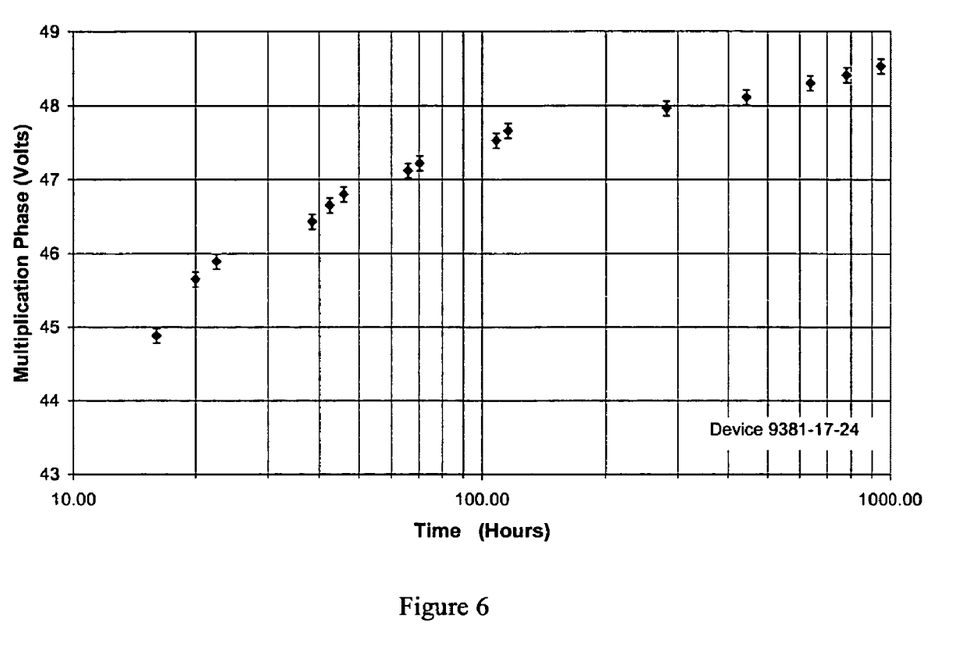
FIG. 6 shows a graph of the multiplication phase voltage required for a given gain against time.

The gain of the low light level CCD has been found to reduce with time. The reduction only occurs whilst the device is running and charge is transferred through the multiplication register. No ageing has been observed if the device is simply left unbiased. FIG. 5 and FIG. 6 illustrate this effect. The mean signal level before multiplication was quite low at approximately 50 electrons per pixel. The bias on the R$\phi$HV was set such that a gain of 1000 was maintained. This ageing effect can be quite significant and as a result biases will have to be adjusted throughout life to maintain performance. This adjustment of the biases cannot continue indefinitely as a limit will be reached when the fields are such that the dielectrics break down and the device fails.

Figure 7:
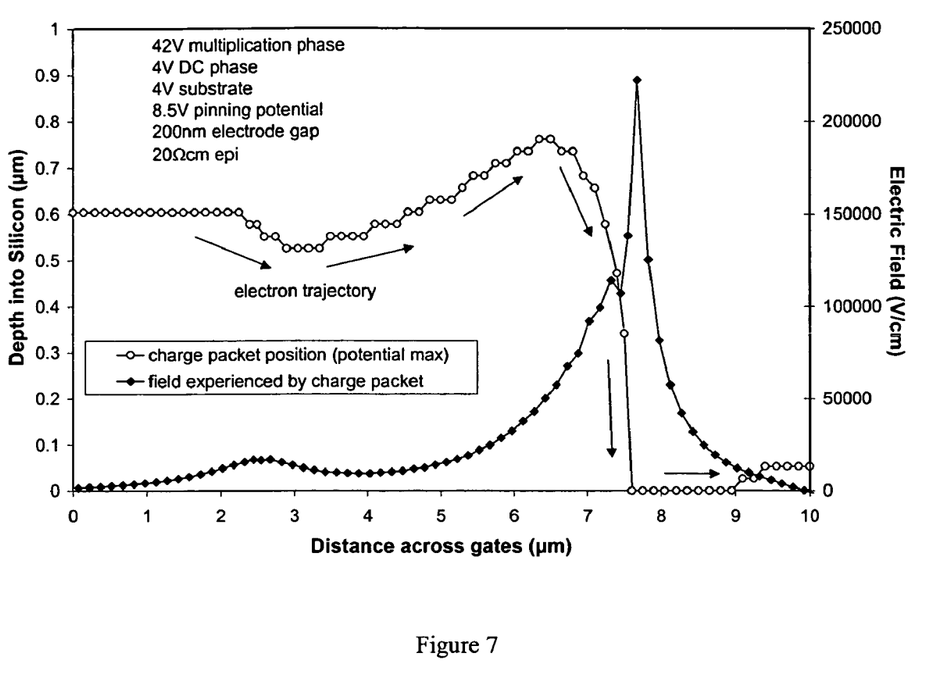
FIG. 7 shows a graph of electron trajectory in a known device.

Using the calculated potential distributions the electron trajectories and the electric fields experienced by the signal electrons can be calculated. Typical results of this calculation are shown in FIG. 7. This shows the trajectory and the magnitude of the electric field seen by an electron as it transfers from under the center of R$\phi$1, through RpDC, to R$\phi$2HV. It is clear from FIG. 7, that the signal electrons are encountering the $Si/SiO_2$ interface under R$\phi$2HV. Not only that, they are also incident on the interface at an energy which may be greater than that required to surmount the interfacial energy barrier to enter the $SiO_2$. The hot electron injection causes an increase in trapped negative charge in the oxide, thus a flat band voltage shift in this region and a change in the operating point of the device. This explains the ageing of the low light level CCDs.

It should be noted that the drift of the signal electrons at the $Si/SiO_2$ interface will not cause a significant reduction in the charge transfer efficiency (CTE) due to the high electron velocity and thus the low probability of capture by interface states. However, once the electrons are transferred to R$\phi$2HV their velocity reduces to the electron thermal velocity. As they now are much slower, the probability of capture will be high, if they now come into contact with the interface. It can be seen from FIG. 7 that the signal will be stored very close to the interface. Thus quite small signal packets will come into contact with the $Si/SiO_2$ interface and a poor CTE may be observed.

The embodiment of the invention overcomes the effect noted by doping a region below electrode R$\phi$2HV such that the charge density in the region is higher than the surrounding charge density. As an example, the normal doping level of n-type (layer 22) is $10^{16}$ phosphorous atoms/cm$^3$. The higher level of doping in the chosen region may be of the order 1.5 to 6 times normal, preferably the doping level is of the order 2 to 4 times the normal level, in particular 3 times normal. The depth over which the doping applies is typically 1 micrometer.

Figure 8:
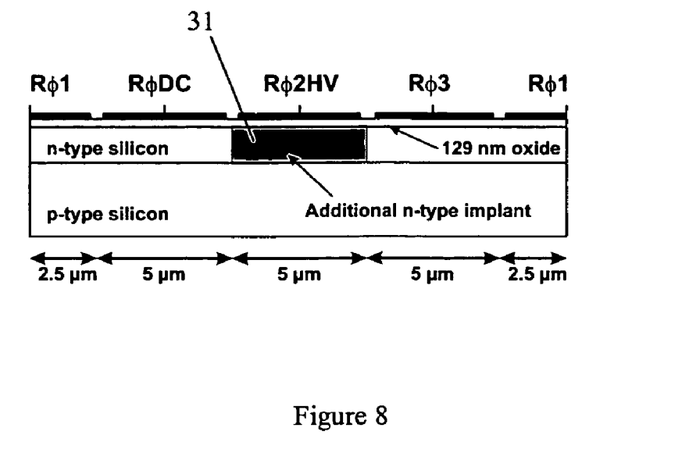
FIG. 8 shows a multiplication element embodying the invention.

The potential experienced by the signal electrons, and therefore their trajectory, is thereby modified by adjusting the buried channel implant levels. If an extra n-type implant 31 is added under the multiplication phase, as illustrated in FIG. 8, the signal electrons can be prevented from interacting with the gate oxides. The n-type implant is, for example, phosphorus. For a p-type arrangement, the doping could be boron. Alternatively, this could be achieved by adding a compensating implant under all phases other than the multiplication phase. The key point is that the depleted charge density of the region under R$\phi$2HV is higher than the surrounding semiconductor.

Figure 9:
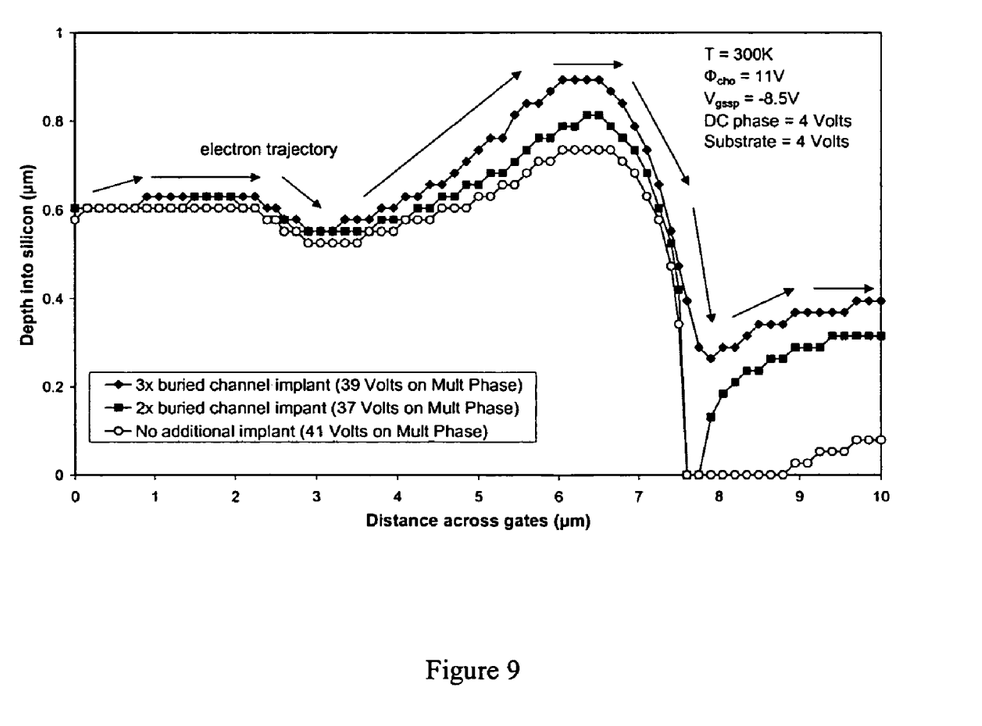
FIG. 9 shows a graph of electron trajectory in a multiplication element embodying the invention.

The effectiveness of this implant has been studied and the results of the modelling are presented in FIG. 9. Here the electron trajectories are shown for no additional implant and also for a total implant level of 2 and 3 times that of the "normal" buried channel. The biases applied to the multiplication gate have been chosen to produce a gain of approximately 1% per element in each case.

In this particular structure a total implant level of 2 times the normal buried channel implant is not sufficient to prevent the high energy electrons from hitting the gate dielectric. An implant of 3 times the normal buried channel implant, however, appears to be very effective.

The signal is held sufficiently far from the interface to ensure that there will be no hot electron injection. In addition, the charge capacity of the multiplication register is increased significantly.

This approach eliminates the ageing effect and also improves the performance of the multiplication register in terms of capacity. Higher gains may be achievable whilst still maintaining performance.

Figure 10:
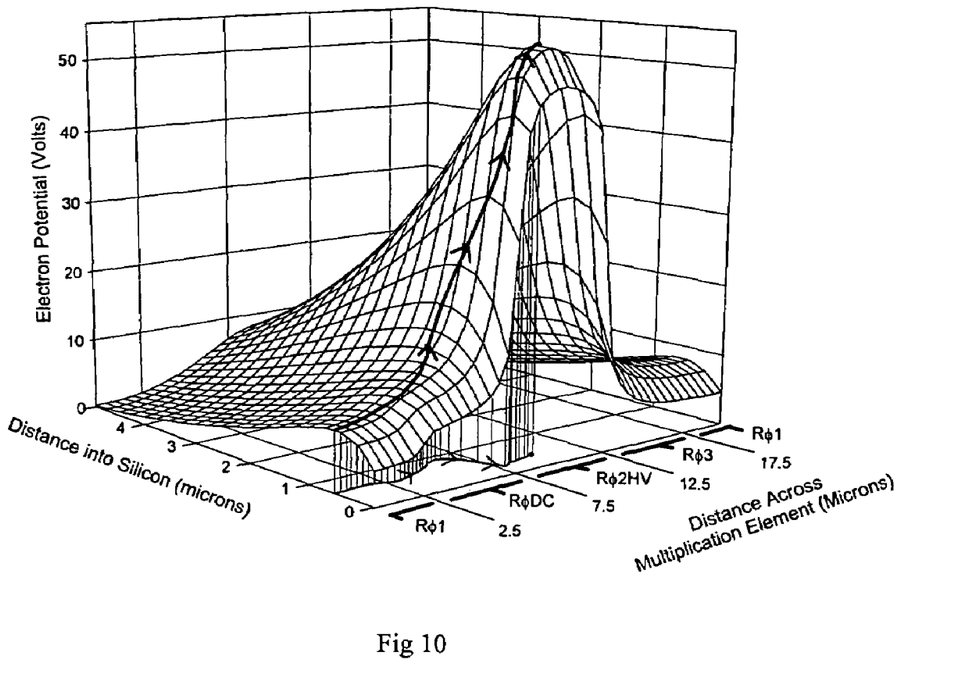
FIG. 10 shows the potential distribution in a multiplication element embodying the invention.

The potential distribution within the silicon layer as a result of the doping arrangement of the embodiment is shown in FIG. 10. As can be seen, there is an additional voltage difference into the depth of the silicon, not present in the distribution of the known art shown in FIG. 4.

Figure 11:
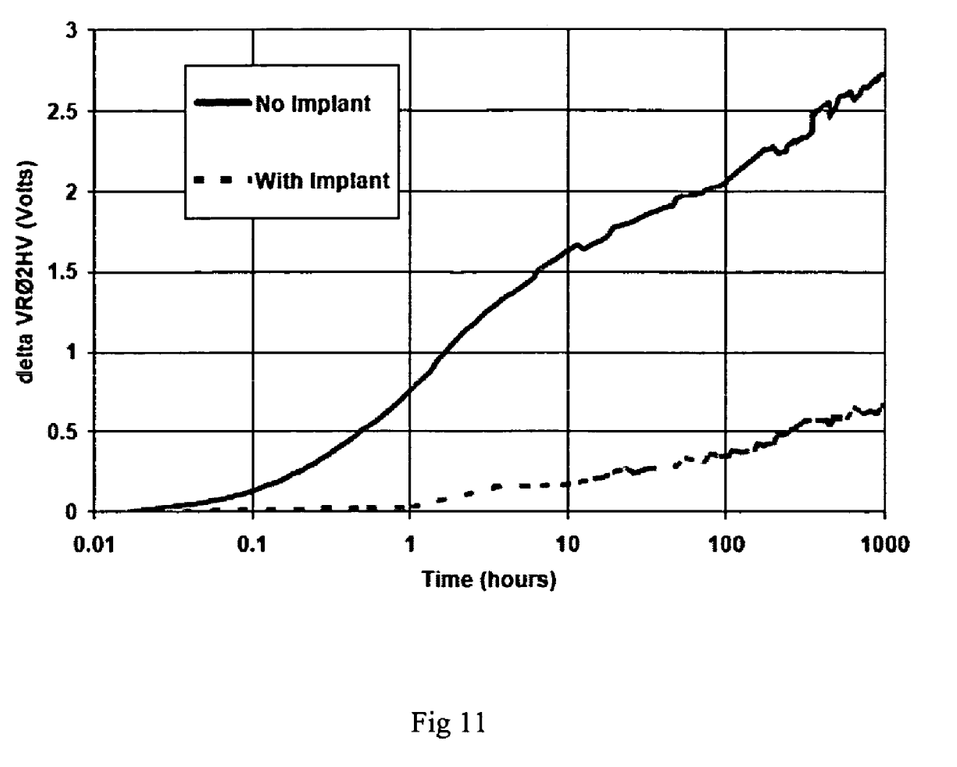
FIG. 11 shows the difference in a performance with and without an implant.

The improved performance over time can be seen with reference to FIG. 11, which shows how a potential under $R\phi2HV$ increases slower over time with the use of the invention.

The invention claimed is:

1. A CCD device of the type in which charge gain is attained by impact ionisation within multiple elements, each element comprising: a sequence of electrodes on the surface of a semiconductor one of the sequence of electrodes being a high voltage electrode and having a voltage level applied, in use, so as to cause charge multiplication, a region of the semiconductor beneath the high voltage electrode being so doped in relation to a region under at least the preceding electrode in the sequence so as to have a higher depleted charge density than under the preceding electrode in the sequence.

2. A CCD device according to claim 1, wherein the device is a clocked CCD image sensor.

3. A CCD device according to claim 1, wherein the depleted charge density of the region is such as to prevent electrons hitting a surface of the device.

4. A CCD device according to claim 1, wherein the region under the high voltage electrode comprises n-type doping within an n-type layer, the region having a doping level higher than under the preceding electrode.

5. A CCD device according to claim 1, wherein the region under the high voltage electrode comprises p-type doping within a p-type layer, the region having a doping level higher than under the preceding electrode.

6. A CCD device according to claim 4, wherein the doping level of the region is of the order 2 to 4 times higher than under the preceding electrode.

7. A CCD device according to claim 4, wherein the doping level of the region is of the order 1.5 to 6 times higher than under the preceding electrode.

8. A CCD device according to claim 1, wherein the device is a buried channel device having a substrate of one dopant type and a layer of opposite dopant type, wherein the region of higher charge density is in the layer of opposite dopant type.

9. A CCD device according to claim 1, wherein the dopant level of the semiconductor is of the order $10^{16}$ atoms/cm$^3$ and the dopant level of the region under the high voltage electrode is a multiple of this level.

* * * * *